(12) United States Patent
Lee et al.

(10) Patent No.: US 12,463,561 B2
(45) Date of Patent: Nov. 4, 2025

(54) ELECTROSTATIC CHUCK

(71) Applicant: Samsung Display Co., LTD., Yongin-si (KR)

(72) Inventors: Hyunjun Lee, Yongin-si (KR); Jinwook Kim, Yongin-si (KR); Hyoseung Kim, Yongin-si (KR); Sangil Nam, Yongin-si (KR); Jaegu Ji, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 204 days.

(21) Appl. No.: 18/143,340

(22) Filed: May 4, 2023

(65) Prior Publication Data

US 2023/0402943 A1    Dec. 14, 2023

(30) Foreign Application Priority Data

Jun. 10, 2022    (KR) .......................... 10-2022-0070995

(51) Int. Cl.
    *H02N 13/00*    (2006.01)
(52) U.S. Cl.
    CPC .................................. *H02N 13/00* (2013.01)
(58) Field of Classification Search
    CPC ... H02N 13/00; H01L 21/683; H01L 21/6833; G01N 29/14

USPC ........................................................ 361/234
    See application file for complete search history.

(56) References Cited

U.S. PATENT DOCUMENTS

| | | | |
|---|---|---|---|
| 5,413,360 A | 5/1995 | Atari et al. | |
| 2006/0023393 A1* | 2/2006 | Poh ......... | B23Q 3/154 |
| | | | 361/234 |
| 2009/0061542 A1* | 3/2009 | Patrick ..................... | C23C 16/50 |
| | | | 324/71.2 |
| 2014/0208850 A1* | 7/2014 | Kim .................. | H01L 21/67288 |
| | | | 73/587 |
| 2021/0166920 A1* | 6/2021 | Koshimizu ........ | H01J 37/32935 |
| 2023/0005723 A1* | 1/2023 | Kim .................. | H01L 21/67069 |

FOREIGN PATENT DOCUMENTS

| | | |
|---|---|---|
| EP | 2450948 | 11/2018 |
| KR | 1020110094218 | 8/2011 |
| KR | 101319765 | 10/2013 |
| KR | 1020190064254 | 6/2019 |
| KR | 102148430 | 8/2020 |
| KR | 1020220007799 | 1/2022 |

* cited by examiner

*Primary Examiner* — Danny Nguyen
(74) *Attorney, Agent, or Firm* — CANTOR COLBURN LLP

(57) ABSTRACT

An embodiment provides an electrostatic chuck including: an adsorption area in which an electrode pattern is disposed and to which an object is adsorbed; an outer area around the adsorption area; and a detection pattern disposed in the outer area and surrounding at least a portion of the adsorption area.

17 Claims, 11 Drawing Sheets

ELECTROSTATIC CHUCK

This application claims priority to Korean Patent Application No. 10-2022-0070995, filed on Jun. 10, 2022, and all the benefits accruing therefrom under 35 U.S.C. § 119, the of which in its entirety is herein incorporated by reference.

BACKGROUND

(a) Field

This disclosure relates to an electrostatic chuck, and more particularly, to an electrostatic chuck that may be used for fixing an object by using an electrostatic force in a manufacturing process of an electronic device.

(b) Description of the Related Art

In a manufacturing process of a display device, a semiconductor device, and the like, an electrostatic chuck may be used to fix or transfer an object to be adsorbed such as a substrate and a wafer. The electrostatic chuck may be configured in a way such that a force that attracts an object, that is, an electrostatic force, is formed by an electric potential charged to an electrode provided therein and the object to be adsorbed. The electrostatic chuck may include an adsorption area in which an electrode pattern for inducing an electrostatic force is disposed, and an outer area in which no electrode pattern is disposed.

SUMMARY

An adsorption area of an electrostatic chuck may be in contact with an adsorption object, and if a problem occurs in the adsorption area, the use of the electrostatic chuck may be impossible due to disconnection of the electrode pattern. Since the outer area of the electrostatic chuck is not an area for adsorbing the adsorption object even if an abnormality occurs, a process using the electrostatic chuck may be performed. However, occurrence of the abnormality in the outer area of the electrostatic chuck may affect the adsorption object, and for example, may damage the adsorption object.

Embodiments are to provide an electrostatic chuck that may detect an occurrence of the abnormality in an outer area of an electrostatic chuck.

An embodiment provides an electrostatic chuck including: an adsorption area in which an electrode pattern is disposed and to which an object is adsorbed; an outer area disposed around the adsorption area; and a detection pattern disposed in the outer area and surrounding at least a portion of the adsorption area.

In an embodiment, the electrode pattern may include an electrode, and the detection pattern may include a detection line connected to the electrode.

In an embodiment, the detection line may be integrally formed with the electrode as a single unitary and indivisible part.

In an embodiment, the electrostatic chuck may further include a power source which applies a voltage to the electrode, and the detection line may be connected to the power source.

In an embodiment, the electrode pattern may include a first electrode and a second electrode, and the detection pattern may include a first detection line and a second detection line. In such an embodiment, the first detection line may be connected to the first electrode, and the second detection line may be connected to the second electrode.

In an embodiment, the first detection line may be integrally formed with the first electrode as a single unitary and indivisible part, and the second detection line may be integrally formed with the second electrode as a single unitary and indivisible part.

In an embodiment, the electrostatic chuck may further include a power source which applies a voltage to the first electrode and the second electrode, and the first detection line and the second detection line may be connected to the power source.

In an embodiment, the first electrode may receive a voltage of a first polarity from the power source through the first detection line, and the second electrode may receive a voltage having a second polarity opposite to the first polarity from the power source through the second detection line.

In an embodiment, the first detection line may surround a lower left side of the adsorption area, and the second detection line may surround a lower right side of the adsorption area.

In an embodiment, the first detection line may surround an upper left side, a left side, and a lower left side of the adsorption area, and the second detection line may surround an upper right side, a right side, and a lower right side of the adsorption area.

In an embodiment, the electrostatic chuck may further include suction holes defined in the adsorption area and which provides vacuum force.

Another embodiment provides an electrostatic chuck including: an adsorption area in which an electrode pattern including electrodes for inducing electrostatic force is disposed; an outer area around the adsorption area; and a detection pattern disposed in the outer area and including a detection line surrounding at least a portion of the adsorption area.

In an embodiment, the detection line may be connected to at least one selected from the electrodes.

In an embodiment, the detection line may be integrally formed with at least one selected from the electrodes as a single unitary and indivisible part.

In an embodiment, the electrostatic chuck may further include a power source which applies a voltage to the electrodes, and the detection line may be connected to the power source.

In an embodiment, the electrodes may include a first electrode and a second electrode to which voltages of different polarities are respectively applied, and the detection pattern may include a first detection line and a second detection line. In such an embodiment, the first detection line may be connected to the first electrode, and the second detection line may be connected to the second electrode.

In an embodiment, the electrostatic chuck may further include a power source which applies a voltage to the first electrode and the second electrode. In such an embodiment, the first electrode may receive a positive voltage from the power source through the first detection line, and the second electrode may receive a negative voltage from the power source through the second detection line.

In an embodiment, the first detection line may surround a lower left side of the adsorption area, and the second detection line may surround a lower right side of the adsorption area.

In an embodiment, a portion of the detection line disposed between the adsorption area and an edge of the electrostatic chuck and extending parallel to the edge may be spaced apart from the edge.

In an embodiment, a portion of the detection line disposed between the adsorption area and an edge of the electrostatic chuck and extending parallel to the edge may be in contact with the edge.

According to embodiments, by providing a detection pattern in an outer area of an electrostatic chuck, it is possible to determine or detect an occurrence of an abnormality in the outer area, such that it is possible to prevent damage to an adsorption object that may occur as a process using the electrostatic chuck having an abnormality in the outer area thereof is performed.

DETAILED DESCRIPTION

Figure 1:
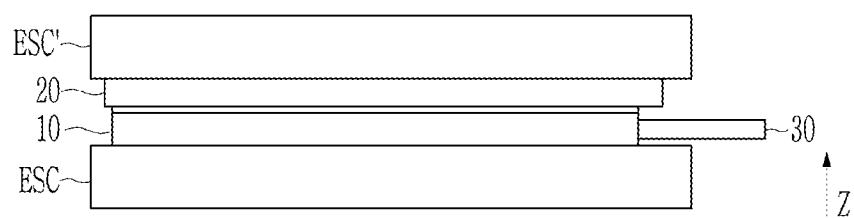
FIG. 1 illustrates a schematic view of an electrostatic chuck in an environment of use according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, film, area, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Throughout the specification, "connected" does not mean only when two or more elements are directly connected, but when two or more elements are indirectly connected through other elements, and when they are physically connected or electrically connected, and further, it may be referred to as elements of different names depending on a position or function, and may also be referred to as a case in which respective parts that are substantially integrated are linked to each other.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the drawings, as symbols X, Y, and Z used for indicating directions, 'X' is a first direction, 'Y' is a second direction perpendicular to the first direction, and 'Z' is a third direction perpendicular to the first direction and the second direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
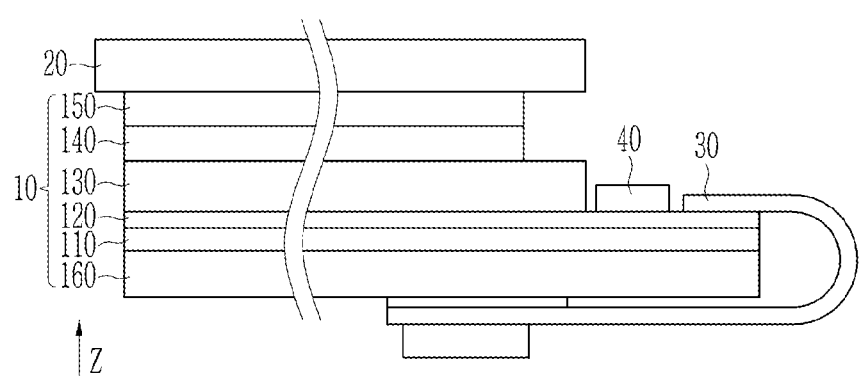
FIG. 2 illustrates a schematic cross-sectional view of a display device according to an embodiment.
Figure 3:
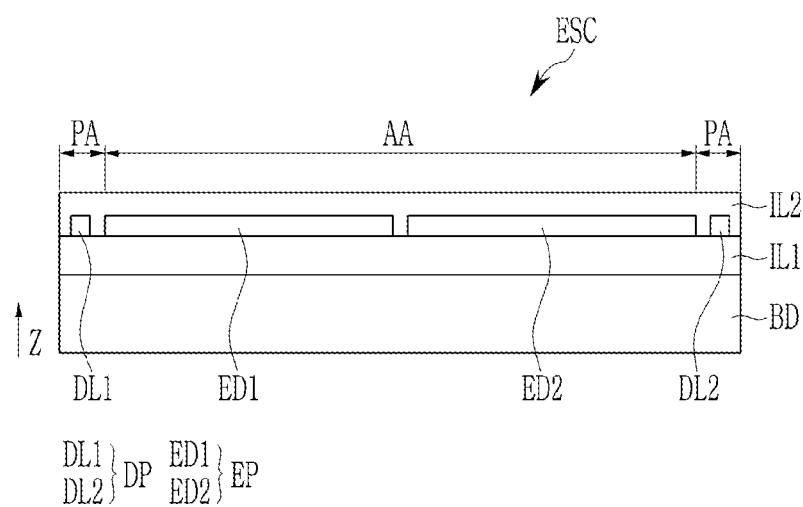
FIG. 3 illustrates a schematic cross-sectional view of an electrostatic chuck according to an embodiment.

FIG. 1 illustrates a schematic view of an electrostatic chuck in an environment of use according to an embodiment, FIG. 2 illustrates a schematic cross-sectional view of a display device according to an embodiment, and FIG. 3 illustrates a schematic cross-sectional view of an electrostatic chuck according to an embodiment.

Referring to FIG. 1, an embodiment of electrostatic chucks ESC and ESC' may be used as a jig in a lamination process for bonding a display panel 10 and a cover window 20 to each other. In a state in which the display panel 10 is adsorbed to the electrostatic chuck ESC and the cover window 20 is adsorbed to the electrostatic chuck ESC', the display panel 10 and the cover window 20 may be bonded to each other, by moving (e.g., raising) the electrostatic chuck ESC or moving (e.g., lowering) the electrostatic chuck ESC' to closely contact the display panel 10 and the cover window 20 with each other. For bonding the display panel 10 and the cover window 20 to each other, an adhesive member such as an optically clear adhesive (OCA) or an optically clear resin (OCR) may be disposed between the display panel 10 and the cover window 20 (for example, a rear surface of the cover window 20). When the display panel 10 and the cover window 20 are bonded to each other, a portion of the display panel 10 or a portion of a flexible printed circuit board 30 connected to the display panel 10 may be positioned outside the electrostatic chuck ESC. In a case where an edge of the electrostatic chuck ESC is dented, deformation may occur at the dented position, so that a burr may be formed at the edge of the electrostatic chuck ESC. In this case, during bonding, a bending portion of the display panel 10 or a flexible printed circuit board 30 may be pressed or damaged by the burr, and a defect such as a crack may occur in a wire positioned in the pressed area.

Referring to FIG. 2, the display device may include a display panel 10, a cover window 20, a flexible printed circuit board 30, a driving integrated circuit chip 40, or the like.

The display panel 10 may include a substrate 110, a display layer 120, an encapsulation layer 130, a touch layer 140, an anti-reflection layer 150, and a functional layer 160.

The substrate 110 may be a flexible substrate including a polymer such as polyimide, polyamide, or polyethylene terephthalate. The substrate 110 may be a rigid substrate including glass, quartz, ceramic, or the like.

The display layer 120 may include electrical devices for configuring pixels or driving pixels, for example a transistor, a capacitor, a light emitting diode, a wire, and the like. The display layer 120 may include insulating layers to insulate or protect the electrical devices.

The encapsulation layer 130 may seal the display layer 120 to prevent penetration of moisture, oxygen, and the like into the display layer 120. In an embodiment, the encapsulation layer 130 may be provided in a form of a substrate and may be bonded to the substrate 110 by a sealing material. In an alternative embodiment, the encapsulation layer 130 may be a thin film encapsulation layer that is formed on the display layer 120 and includes at least one inorganic layer and at least one organic layer. In such an embodiment, for example, the thin film encapsulation layer may have a triple-layered structure in which an organic layer is positioned between a first inorganic layer and a second inorganic layer.

The touch layer 140 may include touch electrodes. The touch electrodes may sense a user's touch by using a mutual capacitance method and/or a self-capacitance method. The touch layer 140 may include insulating layers to insulate or protect the touch electrodes. In an embodiment, the touch layer 140 may be formed on the encapsulation layer 130. In an embodiment, after the touch layer 140 is separately formed, the touch layer 140 may be attached to the encapsulation layer 130 by an adhesive member such as an optically clear adhesive (OCA) or an optically clear resin (OCR).

The anti-reflection layer 150 may reduce light reflected by the touch layer 140 and/or the display layer 120. The anti-reflection layer 150 may include a combination of a polarization layer and a phase delay layer. The anti-reflection layer 150 may include a combination of a light blocking member and color filters, or the anti-reflection layer 150 may include a combination of reflective layers causing destructive interference.

The functional layer 160 may be positioned on a rear surface of the substrate 110. The functional layer 160 may include at least one selected from a cushion layer for absorbing an external impact, a light absorbing layer for absorbing external light, a heat dissipation layer emitting heat, and a shielding layer shielding electromagnetic waves.

The cover window 20, while transmitting an image displayed by the display layer 120 of the display panel 10, may protect the display panel 10 from the external environment. The cover window 20 may include or be formed of a transparent material such as glass or plastic. The cover window 20 may be attached to the anti-reflection layer 150 by an adhesive member such as an optically clear adhesive (OCA) or an optically clear resin (OCR).

During the lamination process of bonding the touch layer 140 or the anti-reflection layer 150 to the display panel 10 as well as bonding the display panel and the cover window 20 to each other, the electrostatic chucks ESC and ESC' may be used.

The flexible printed circuit board 30 may be bonded to a lower end edge of the display panel 10. The flexible printed circuit board 30 may transmit signals for operating the display panel 10 to the display panel 10. The flexible printed circuit board 30 may be bent while surrounding the lower end edge of the display panel 10. Accordingly, most of the flexible printed circuit board 30 may be positioned on the rear surface of the display panel 10, a portion protruding from the display panel 10 may be minimized, and a size of the display device may be reduced. In an embodiment, the flexible printed circuit board 30 may be attached to the rear surface of the display panel 10 through an adhesive member to maintain the flexible printed circuit board 30 in a bent state.

The driving integrated circuit chip 40 may be positioned at the lower end portion of the display panel 10. The driving integrated circuit chip 40 may output a data voltage to be applied to the pixels. The driving integrated circuit chip 40 may be positioned on a flexible printed circuit board 30.

Referring to FIG. 3, the electrostatic chuck ESC may include a body BD, a first insulating layer IL1, a second insulating layer IL2, an electrode pattern EP, and a detection pattern DP. The electrostatic chuck ESC may be a coulomb electrostatic chuck or a Johnson-Rahbek electrostatic chuck, but is not limited thereto.

The body BD may include a metal such as aluminum, iron, titanium, copper, or stainless steel. The body BD may include a ceramic. The body BD may have a substantially hexahedral shape.

The first insulating layer IL1 may be positioned on the body BD. The first insulating layer IL1 may be in a form of a substrate including a polymer such as polyimide, polyamide, or polyethylene terephthalate. In an embodiment, for example, the first insulating layer IL1 may be a polyimide substrate.

An electrode layer including the electrode pattern EP and the detection pattern DP may be positioned on the first insulating layer IL1. The electrode pattern EP may be positioned in the adsorption area AA on which an object to be adsorbed (for example, a display panel) is adsorbed, and the detection pattern DP may be positioned in an outer area PA.

The electrode pattern EP may include a first electrode ED1 and a second electrode ED2. In an embodiment where the electrostatic chuck ESC is a bi-polar type, one of the first electrode ED1 and the second electrode ED2 may be a positive electrode to which a positive voltage is applied, and the other thereof may be a negative electrode to which a negative voltage is applied. The electrodes ED1 and ED2 may be electrically connected to a power source (not shown) of the electrostatic chuck ESC to receive a voltage. When a positive voltage and a negative voltage are respectively applied to the positive electrode and the negative electrode in a state in which the object to be adsorbed is positioned corresponding to the adsorption area AA of the electrostatic chuck ESC, an electrostatic force may be generated by charging the areas of the object to be adsorbed corresponding to the positive electrode and the negative electrode with opposite potentials, thus the object to be adsorbed may be adsorbed to the adsorption area AA. In an embodiment, the electrostatic chuck ESC may be of a mono-polar type, and in such an embodiment, the first electrode ED1 and the second electrode ED2 may each receive a voltage having the same polarity.

The detection pattern DP may include one or more detection lines DL1 and DL2. The detection pattern DP may be used to detect defects such as dents that may occur in the outer area PA. The detection pattern DP may be electrically connected to the power source of the electrostatic chuck ESC to receive a voltage. The detection pattern DP may include or be formed of a same material as the electrode pattern EP and may be formed along with the electrode pattern EP during a same process. The detection pattern DP may be formed separately from the electrode pattern EP and be provided on a peripheral area thereof or a side surface of the body BD.

The electrode pattern EP and the detection pattern DP may include a metal such as copper, aluminum, gold, silver, platinum, titanium, tungsten, or molybdenum, but are not limited thereto, and alternatively, the electrode pattern EP and the detection pattern DP may include at least one selected from other various conductive materials.

The second insulating layer IL2 may cover the electrode pattern EP and the detection pattern DP. The second insulating layer IL2 may configure a dielectric layer of the electrostatic chuck ESC. The second insulating layer IL2 may be an organic insulating layer including a polymer such as polyimide, polyamide, or polyethylene terephthalate. The second insulating layer IL2 may include an inorganic insulating layer.

The first insulating layer IL1, the electrode layer, and the second insulating layer IL2 may be in a form of a film. In an embodiment, for example, a film including the first insulating layer IL1, the electrode layer, and the second insulating layer IL2 may be attached to the body BD by an adhesive member. At one end of the film, a connection portion (not shown) for connecting the electrode pattern EP and the detection pattern DP to the power source may be provided. The connection portion may extend to a lower surface of the body BD along a side surface of the body BD.

Figure 4:
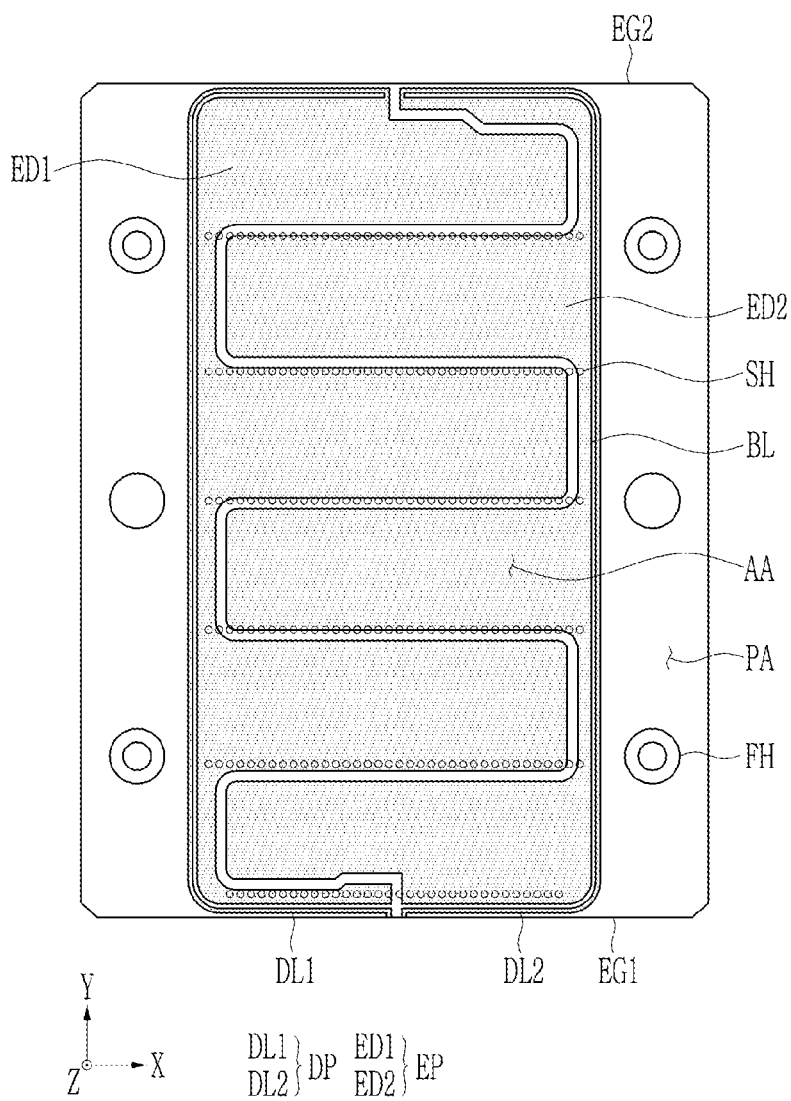
FIG. 4 illustrates a top plan view of an electrostatic chuck according to an embodiment.
Figure 5:
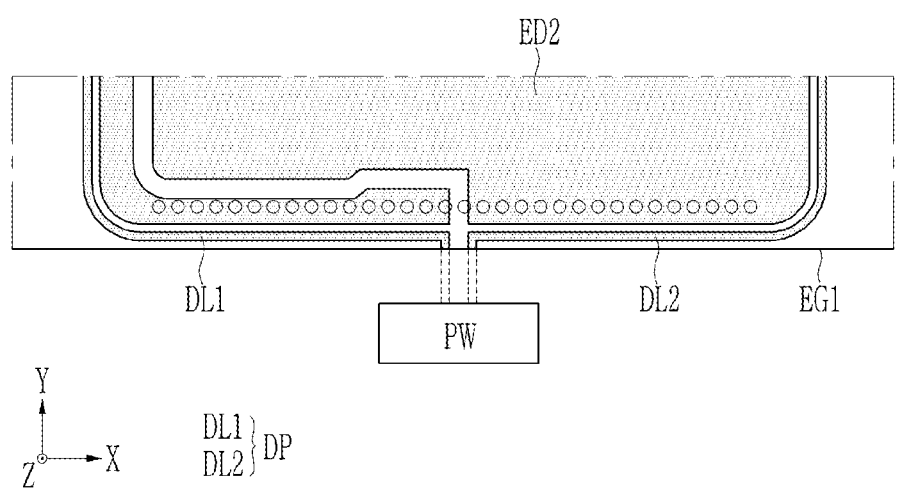
FIG. 5 and FIG. 6 respectively illustrate a partially enlarged view of a lower end portion of the electrostatic chuck illustrated in FIG. 4.
Figure 6:
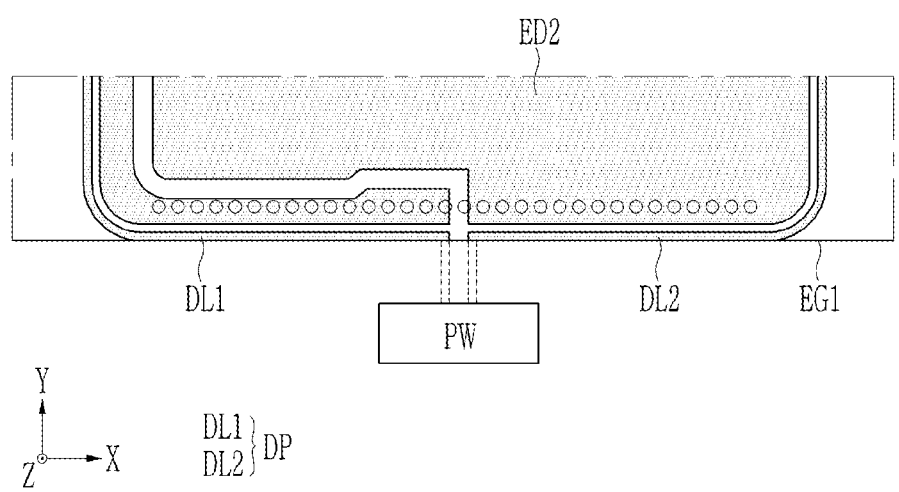
Figure 7:
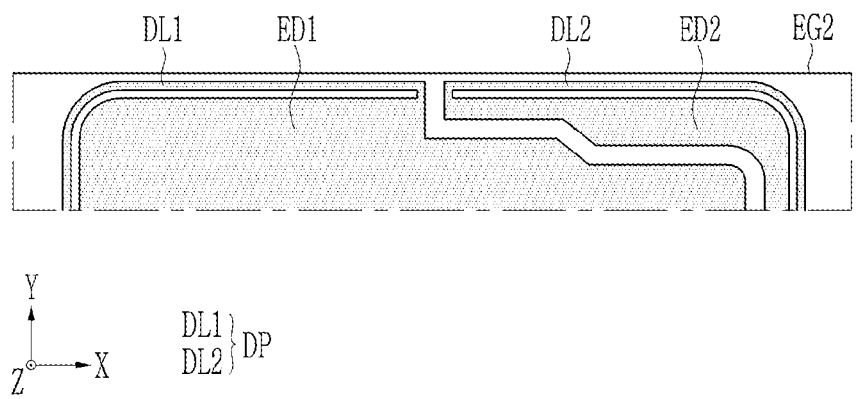
FIG. 7 and FIG. 8 respectively illustrate a partially enlarged view of an upper end portion of the electrostatic chuck illustrated in FIG. 4.
Figure 8:
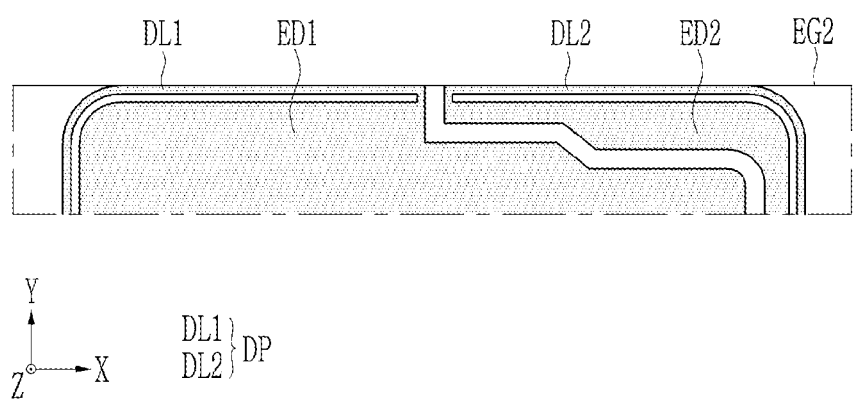

FIG. 4 illustrates a top plan view of an electrostatic chuck according to an embodiment, FIG. 5 and FIG. 6 respectively illustrate a partially enlarged view of a lower end portion of the electrostatic chuck illustrated in FIG. 4, and FIG. 7 and FIG. 8 respectively illustrate a partially enlarged view of an upper end portion of the electrostatic chuck illustrated in FIG. 4.

FIG. 4 to FIG. 8 show a surface of the electrostatic chuck ESC on which an object to be adsorbed is adsorbed. The electrostatic chuck ESC may include an adsorption area AA inside a boundary line BL and an outer area PA outside the boundary line BL, which are shown as a quadrangle with rounded corners. The adsorption area AA is an area on which an object to be adsorbed is adsorbed, and electrodes ED1 and ED2 for inducing electrostatic force may be positioned in the adsorption area AA. The boundary line BL may correspond to (or be defined by) an edge of the electrode pattern EP. Although embodiments in which the electrode pattern EP includes a single first electrode ED1 and a single second electrode ED2, which are interlocked, are shown, the number of the electrodes ED1 and ED2 of the electrode pattern EP may be variously changed.

The adsorption area AA may have a shape corresponding to a planar shape of the adsorption object (for example, the display panel), but is not limited thereto. Suction holes SH may be formed in the adsorption area AA, and vacuum force may be provided through the suction holes SH to enhance the adsorption force. In an embodiment where the electrostatic chuck ESC has the cross-sectional structure shown in FIG. 3, the suction hole SH may be defined or formed through the body BD, the first insulating layer IL1, and the second insulating layer IL2. In such an embodiment, holes for providing vacuum force may not be formed in the adsorption area AA.

In an embodiment, the detection lines DL1 and DL2 may be disposed in the outer area PA. In such an embodiment, the detection lines DL1 and DL2 may be disposed adjacent to the adsorption area AA to detect an abnormality occurring near the adsorption area AA. The detection lines DL1 and DL2 may be positioned around the adsorption area AA. The detection lines DL1 and DL2 may be electrically connected to a power source PW (or a driving portion), and may receive a voltage from the power source PW. When an abnormality such as a dent occurs at a position at which the detection lines DL1 and DL2 are disposed, a crack may occur in the detection lines DL1 and DL2, which may result in a disconnection or an increase in resistance. Accordingly, when the power source PW does not receive an output signal of the detection lines DL1 and DL2 or receives a weak output signal thereof, it may be determined or detected that an abnormality has occurred in an area in which the detection lines DL1 and DL2 are disposed.

The detection lines DL1 and DL2 may include a first detection line DL1 positioned to the left side of a center line of the adsorption area AA in a second direction Y and a second detection line DL2 positioned to the right side of the center line of the adsorption area AA in the second direction Y. The first detection line DL1 may surround an upper left side, a left side, and a lower left side of the adsorption area AA. The second detection line DL2 may surround an upper right side, a right side, and a lower right side of the adsorption area AA. As described above, when the detection lines DL1 and DL2 are disposed to the left and right sides, respectively, it may be checked whether an abnormality has occurred at the left or right side of the adsorption area AA. In a substantially central portion of an upper end of the adsorption area AA, the first detection line DL1 may be connected to the first electrode ED1, and the second detection line DL2 may be connected to the second electrode ED2, as shown in FIG. 7. The first detection line DL1 may be integrally formed with the first electrode ED1 as a single unitary and indivisible part, and the second detection line DL2 may be integrally formed with the second electrode ED2 as a single unitary and indivisible part. One end and the other end of the first detection line DL1 may be connected to the power source PW and the first electrode ED1, respectively, and one end and the other end of the second detection line DL2 may be connected to the power source PW and the second electrode ED2, respectively. Accordingly, the first electrode ED1 may be connected to the power source PW through the first detection line DL1, and the second electrode ED2 may be connected to the power source PW through the second detection line DL2. The first electrode ED1 may receive a voltage of a first polarity (for example, a positive polarity) from the power source PW through the first detection line DL1, and the second electrode ED2 may receive a voltage of a second polarity (for example, a negative polarity) opposite to the first polarity from the power source PW through the first detection line DL1.

Unlike those illustrated, the two detection lines may be respectively disposed at upper and lower sides of a center line of the adsorption area AA in a first direction X. One detection line may be disposed in the outer area PA, or three or more detection lines may be disposed therein. Each of the detection lines DL1 and DL2 may have a loop shape in which both ends are connected to the power source PW.

Since an electrode pattern that generates electrostatic force for adsorbing an object to be absorbed is not disposed in the outer area PA, even if an abnormality occurs in the outer area PA, the object to be adsorbed may be effectively adsorbed by the adsorption area AA. Accordingly, the process such as lamination may be continuously performed by using the electrostatic chuck ESC without noticing the abnormality of the outer area PA. However, the occurrence of the abnormality in the outer area PA may damage a portion of the object to be adsorbed positioned outside the adsorption area AA, or may deteriorate the quality. In an embodiment, as described above, by disposing the detection lines DL1 and DL2 in the outer area PA, the occurrence of the abnormality in the outer area PA may be quantitatively and immediately checked. When the abnormality in the outer area PA includes a protruding portion such as a burr, the object to be absorbed may be stabbed by the protruding portion during the lamination process, so that it is possible to prevent occurrence of a defect by stopping the process until the problem is resolved.

A fastening hole FH for coupling the electrostatic chuck ESC to a stage (not shown) may be defined or formed in the outer area PA. In an embodiment, for example, a fastening member such as a screw may be inserted through the fastening hole FH to be fixed to the stage, and by moving the stage, the electrostatic chuck ESC fixed thereto may be moved.

In an embodiment, the detection lines DL1 and DL2 may be spaced apart from edges EG1 and EG2 of the electrostatic chuck ESC by a predetermined distance as shown in FIG. 5 and FIG. 7. Alternatively, the detection lines DL1 and DL2 may be in contact with the edges EG1 and EG2 as shown in FIG. 6 and FIG. 8. Since defects such as dents easily occur at the edges EG1 and EG2 of the electrostatic chuck ESC, it may be desired to detect anomalies when the detection lines DL1 and DL2 are positioned within a predetermined distance from the edges EG1 and EG2 of the electrostatic chuck ESC. In an embodiment, for example, the distance between the portions of the detection lines DL1 and DL2 extending parallel to the edges EG1 and EG2 of the electrostatic chuck ESC and the edges EG1 and EG2 may be about 1 millimeter (mm) or less, about 0.7 mm or less, or about 0.5 mm or less. A width of the detection lines DL1 and DL2 may be about 0.1 mm or more, for example, about 0.5 mm, but is not limited thereto.

Figure 9A:
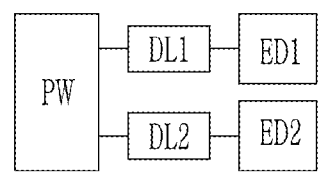
FIG. 9A and FIG. 9B respectively illustrate a block diagram showing a connection between an electrode pattern and a power source in an electrostatic chuck according to an embodiment.
Figure 9B:
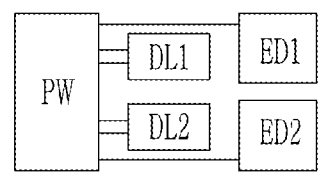

FIG. 9A and FIG. 9B respectively illustrate a block diagram showing a connection between an electrode pattern and a power source in an electrostatic chuck according to an embodiment.

Referring to FIG. 9A, in an embodiment, the first electrode ED1 and the second electrode ED2 of the electrode pattern EP may be connected to the power source PW through the detection lines DL1 and DL2, respectively. In such an embodiment, when the detection lines DL1 and DL2 are damaged due to the abnormal occurrence in the outer area PA, no voltage may be normally applied to the electrode pattern EP. Accordingly, when an abnormality occurs in the outer area PA, the adsorption area AA does not normally operate, so that the process may be stopped and the occurrence of defects in the object to be adsorbed may be effectively prevented. Even if the occurrence of an abnormality in the outer area PA is not separately detected, it may be difficult to determine whether the abnormality occurs in the outer area PA or the electrode pattern EP when the process may be stopped due to the abnormal operation of the adsorption area AA.

Referring to FIG. 9B, in an alternative embodiment, the first electrode ED1 and the second electrode ED2 of the electrode pattern EP may be connected to the power source PW without passing through the detection lines DL1 and DL2. Accordingly, even if an abnormality occurs in the outer area PA and the detection lines DL1 and DL2 are damaged, the electrode pattern EP may normally receive a voltage. Each of the detection lines DL1 and DL2 may have a loop shape in which both ends are electrically connected to the power source PW. In such an embodiment, since the damage to the detection lines DL1 and DL2 does not affect the operation of the adsorption area AA, the power source PW may further include a detection circuit capable of detecting damage to the detection lines DL1 and DL2.

Figure 10:
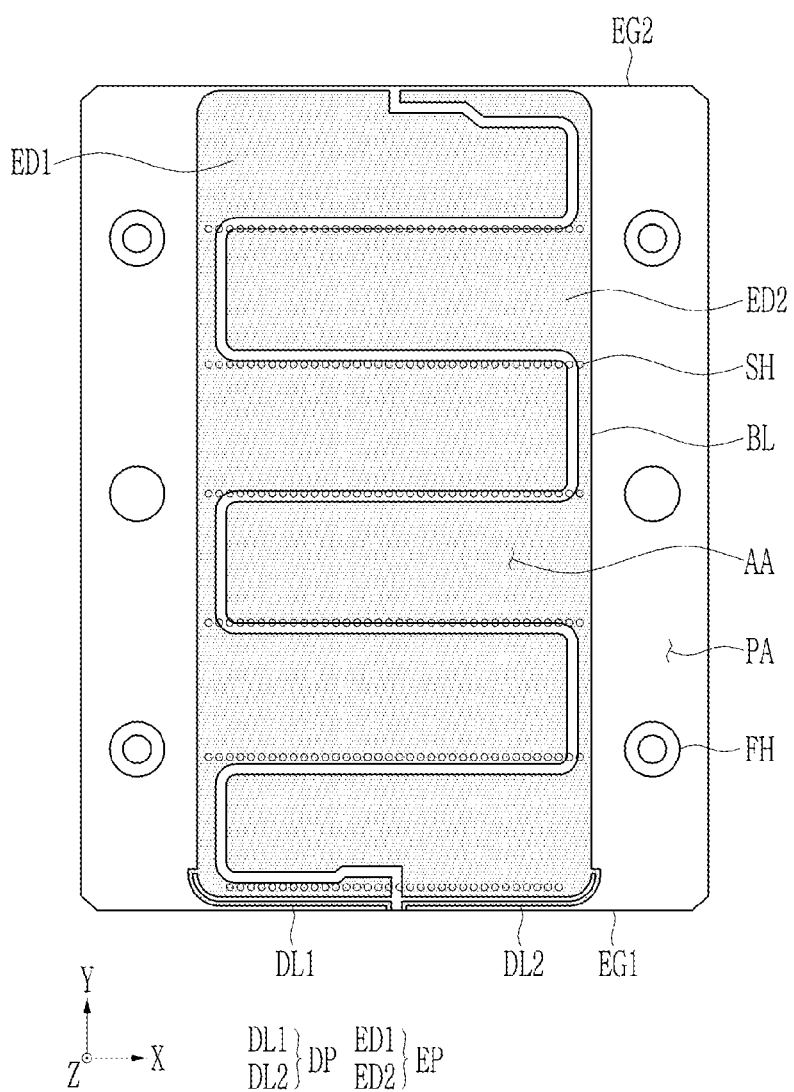
FIG. 10 illustrates a top plan view of an electrostatic chuck according to an embodiment.
Figure 11:
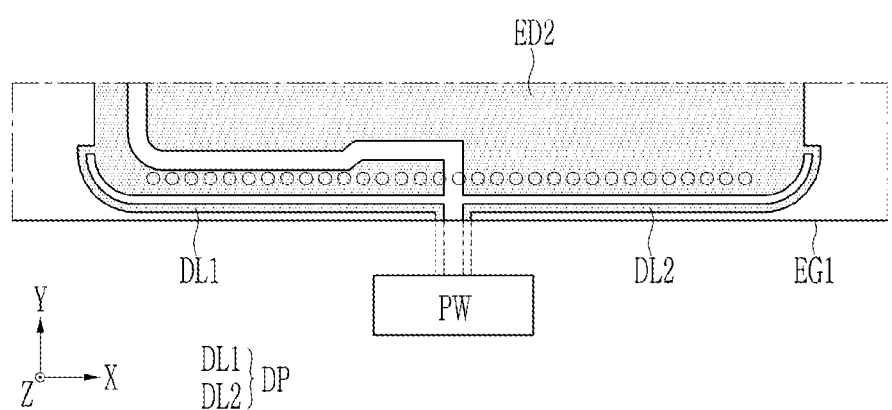
FIG. 11 illustrates a partially enlarged view of a lower end portion of the electrostatic chuck illustrated in FIG. 10.

FIG. 10 illustrates a top plan view of an electrostatic chuck according to an embodiment, and FIG. 11 illustrates a partially enlarged view of a lower end portion of the electrostatic chuck illustrated in FIG. 10.

Referring to FIG. 1 together with FIGS. 10 and 11, when the display panel 10 and the cover window 20 are attached by using the electrostatic chuck ESC, the bending portion of the flexible printed circuit board 30 or the display panel 10 may be placed at the lower edge EG1 of the electrostatic chuck ESC. Even if an abnormality occurs in the outer area PA of the electrostatic chuck ESC, an area that damages the adsorption object such as the display device may be mainly at the lower edge EG1 of the electrostatic chuck ESC. Accordingly, in an alternative embodiment, the detection lines DL1 and DL2 may be formed to be positioned only in a portion of the outer area PA, that is, in the vicinity of the lower edge EG1, rather than entirely surrounding the adsorption area AA. The detection lines DL1 and DL2 may be mainly positioned between the lower end portion of the adsorption area AA and the lower edge EG1.

The detection lines DL1 and DL2 may include a first detection line DL1 positioned to the left and a second detection line DL2 positioned to the right of a center line of the adsorption area AA in a second direction Y. One end of the first detection line DL1 may be connected to the power source PW. The first detection line DL1 may extend to cover a portion or all of the lower left corner of the adsorption area AA, and the other end of the first detection line DL1 may be connected to the first electrode ED1. One end of the second detection line DL2 may be connected to the power source PW. The second detection line DL2 may extend to cover a portion or all of the lower right corner of the adsorption area AA, and the other end of the second detection line DL2 may be connected to the second electrode ED2. When the detection lines DL1 and DL2 are disconnected or a crack occurs due to an abnormality such as a dent in the outer area PA in which the detection lines DL1 and DL2 are disposed, a voltage may not be normally applied to the electrodes ED1 and ED2. Accordingly, it is possible to stop a process such as lamination, and it is possible to prevent an object to be absorbed from being damaged due to an abnormality occurring in the vicinity of the lower edge EG1.

Alternatively, as described above, each of the detection lines DL1 and DL2 may have a loop shape in which both ends are connected to the power source PW, and the electrodes ED1 and ED2 may be connected to the power source PW without passing through the detection lines DL1 and DL2.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electrostatic chuck comprising:
an adsorption area in which an electrode pattern is disposed and to which an object is adsorbed, wherein the electrode pattern includes an electrode;
an outer area around the adsorption area; and
a detection pattern disposed in the outer area and surrounding at least a portion of the adsorption area, wherein the detection pattern includes a detection line connected to, and integrally formed with, the electrode.

2. The electrostatic chuck of claim 1, further comprising a power source which applies a voltage to the electrode, wherein the detection line is connected to the power source.

3. An electrostatic chuck comprising:
an adsorption area in which an electrode pattern is disposed and to which an object is adsorbed, wherein the electrode pattern includes a first electrode and a second electrode;
an outer area around the adsorption area;
a detection pattern disposed in the outer area and surrounding at least a portion of the adsorption area, wherein the detection pattern includes a first detection line and a second detection line,
the first detection line is connected to the first electrode, and
the second detection line is connected to the second electrode.

4. The electrostatic chuck of claim 3, wherein
the first detection line is integrally formed with the first electrode as a single unitary and indivisible part, and
the second detection line is integrally formed with the second electrode as a single unitary and indivisible part.

5. The electrostatic chuck of claim 3, further comprising a power source which applies a voltage to the first electrode and the second electrode,
wherein the first detection line and the second detection line are connected to the power source.

6. The electrostatic chuck of claim 5, wherein
the first electrode receives a voltage of a first polarity from the power source through the first detection line, and
the second electrode receives a voltage having a second polarity opposite to the first polarity from the power source through the second detection line.

7. The electrostatic chuck of claim 3, wherein
the first detection line surrounds a lower left side of the adsorption area, and
the second detection line surrounds a lower right side of the adsorption area.

8. The electrostatic chuck of claim 3, wherein
the first detection line surrounds an upper left side, a left side, and a lower left side of the adsorption area, and
the second detection line surrounds an upper right side, a right side, and a lower right side of the adsorption area.

9. The electrostatic chuck of claim 1, further comprising suction holes defined in the adsorption area and which provides vacuum force.

10. An electrostatic chuck comprising:
an adsorption area in which an electrode pattern including electrodes for inducing electrostatic force is disposed;
an outer area around the adsorption area; and
a detection pattern disposed in the outer area and including a detection line surrounding at least a portion of the adsorption area, wherein the detection line is integrally formed with at least one selected from the electrodes as a single unitary and indivisible part.

11. The electrostatic chuck of claim 10, wherein
the detection line is connected to at least one selected from the electrodes.

12. The electrostatic chuck of claim 10, further comprising a power source which applies a voltage to the electrodes, wherein the detection line is connected to the power source.

13. The electrostatic chuck of claim 10, wherein
the electrodes include a first electrode and a second electrode to which voltages of different polarities are respectively applied,
the detection pattern includes a first detection line and a second detection line,
the first detection line is connected to the first electrode, and
the second detection line is connected to the second electrode.

14. The electrostatic chuck of claim 13, further comprising
a power source which applies a voltage to the first electrode and the second electrode,
wherein the first electrode receives a positive voltage from the power source through the first detection line, and
the second electrode receives a negative voltage from the power source through the second detection line.

15. The electrostatic chuck of claim 13, wherein
the first detection line surrounds a lower left side of the adsorption area, and
the second detection line surrounds a lower right side of the adsorption area.

16. The electrostatic chuck of claim 10, wherein
a portion of the detection line disposed between the adsorption area and an edge of the electrostatic chuck and extending parallel to the edge is spaced apart from the edge.

17. The electrostatic chuck of claim 10, wherein
a portion of the detection line disposed between the adsorption area and an edge of the electrostatic chuck and extending parallel to the edge is in contact with the edge.

* * * * *